(12) United States Patent
Akatsuka et al.

(10) Patent No.: US 6,420,937 B1
(45) Date of Patent: Jul. 16, 2002

(54) VOLTAGE CONTROLLED OSCILLATOR WITH POWER AMPLIFIER

(75) Inventors: Terumoto Akatsuka; Keisuke Utsunomiya, both of Aichi (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/881,413

(22) Filed: Jun. 14, 2001

(30) Foreign Application Priority Data

Aug. 29, 2000 (JP) ........................... 2000-258675
Nov. 24, 2000 (JP) ........................... 2000-357275

(51) Int. Cl.[7] ............................................ H03B 1/00
(52) U.S. Cl. ............................ 331/74; 331/107.52
(58) Field of Search ........................ 331/74, 107.52, 331/182, 183; 455/255, 256

(56) References Cited

U.S. PATENT DOCUMENTS 5,483,206 A * 1/1996 Lohninger ............ 332/107 SL
5,539,359 A * 7/1996 Goma .................. 331/107 SL
5,650,754 A * 7/1997 Joshi et al. ............ 331/36 C

* cited by examiner

Primary Examiner—Tuan T. Lam
(74) Attorney, Agent, or Firm—Ratner & Prestia

(57) ABSTRACT

A high power type voltage controlled oscillator (VCO) includes (a) an input terminal for receiving a controlling voltage, (b) a voltage controlled oscillating section (VCO section) to which the controlling voltage is supplied, (c) a power amplifier to which an output from the VCO section is supplied, (d) a matching circuit to which an output from the power amplifier is supplied, (e) an output terminal to which an output from the matching circuit is supplied, (f) inspection means for adjusting or inspecting independently the VCO section and the amplifier, (g) interference preventive means for preventing interference from the amplifier to the VCO section, (h) a heat sink for dissipating heat generated by the amplifier to outside, and (i) a board in which the elements described in (a)–(h) are accommodated. This structure allows a device such as a cellular phone to be assembled with higher productivity as well as downsized.

43 Claims, 14 Drawing Sheets

VOLTAGE CONTROLLED OSCILLATOR WITH POWER AMPLIFIER

FIELD OF THE INVENTION

The present invention relates to a voltage controlled oscillator used in a device such as a cellular phone. More particularly, it relates to a voltage controlled oscillator with a power amplifier, and the oscillator contributes to downsizing a device which employs the oscillator as well as increasing the productivity of assembling the device.

BACKGROUND OF THE INVENTION

FIG. 24 is a block diagram of a conventional cellular phone employing a voltage controlled oscillator. In FIG. 24, the conventional cellular phone comprises the following elements:
(a) antenna 1;
(b) antenna switch 2 coupled to antenna 1;
(c) surface acoustic wave (SAW) filter 3 coupled to a first terminal of switch 2;
(d) demodulator/modulator 5 receiving an output from filter 3, and including a low noise amplifier (LNA) 4;
(e) control circuit 6 coupled to demodulator/modulator 5;
(f) voltage controlled oscillator (VCO) 7 receiving an output from demodulator/modulator 5;
(g) power amplifier 8 receiving an output from VCO 7; and
(h) low pass filter (LPF) 9 coupled between amplifier 8 and a second terminal of switch 2.

An operation of the conventional cellular phone discussed above is described hereinafter. A signal received by antenna 1 travels through SAW filter 3 and is amplified by LNA 4, then demodulated in a demodulating section of demodulator/modulator 5. An output from demodulator/modulator 5 is decoded by control circuit 6, and displayed on a display section (not shown) and supplied as an audio output.

A signal input through a keyboard (not shown) or an audio signal input through a microphone (not shown) is fed into control circuit 6. An output from control circuit 6 is modulated by a modulating section of demodulator/modulator 5. An output from demodulator/modulator 5 is converted into a carrier wave by VCO 7. An output from VCO 7 is amplified by power amplifier 8 and fed into LPF 9, which removes higher-harmonic. An output from LPF 9 travels through switch 2 and is radiated by antenna 1.

Meanwhile, cellular phones have been well accepted by consumers, and thus components to be assembled with ease into a cellular phone are demanded. Switch 2, SAW filter 3 and LPF 9 can be manufactured by low temperature cofired ceramics technique and have been already integrated onto a board. Demodulator/modulator 5 can be also manufactured by silicon-germanium (SiGe) technique, so that it is integrated into one chip IC. Control circuit 6 is also integrated into one chip complementary-metal-oxide-semiconductor (CMOS.)

Device manufacturers can assemble these integrated components into cellular phones with ease; however, VCO 7 and power amplifier 8 are still not integrated yet. Because both the components fall into different fields in terms of engineering and manufacturing, and thus they are difficult to be integrated.

SUMMARY OF THE INVENTION

The present invention addresses the problem discussed above and aims to provide a voltage controlled oscillator (VCO) with a power amplifier, the oscillator can contribute to simplifying the assembly of devices including a cellular phone.

The VCO with a power amplifier of the present invention comprises the following elements:
(a) an input terminal for receiving a controlling voltage;
(b) a voltage controlled oscillating section (VCO section) for receiving the controlling voltage fed into the input terminal;
(c) a power amplifier for receiving an output from the VCO section;
(d) a matching circuit for receiving an output from the power amplifier;
(e) an output terminal for receiving an output from the matching circuit;
(f) inspection means for adjusting or inspecting the VCO section and the power amplifier independently;
(g) interference preventive means for preventing interference from the power amplifier to the VCO section;
(h) heat dissipation means for dissipating the heat generated by the power amplifier; and
(i) a board for accommodating those components listed in items (a) through (h).

This structure of the VCO with a power amplifier allows devices including a cellular phone to be assembled with ease.

Another VCO with a power amplifier of the present invention comprises the following elements:
(a) an input terminal for receiving a controlling voltage;
(b) a voltage controlled oscillating section (VCO section) for receiving the controlling voltage fed into the input terminal;
(c) a power amplifier for receiving an output from the VCO section, and a plurality of amplifying circuits are coupled to each other in series; and
(d) an output terminal for receiving an output from the power amplifier.

The VCO section and an amplifying circuit at least on the first stage of the power amplifier include a balance amplifying circuit, and a balance to/from unbalance converting circuit is provided in the power amplifier, which outputs an unbalance signal. The components listed (a) through (d) are accommodated in a multi-layered board which allows surface mounting.

This structure allows the VCO with a power amplifier to be mounted as it is to the devices including a cellular phone, thus the devices can be manufactured with ease. The power amplifying circuit on the final stage in the power amplifier outputs an unbalance signal, so that a balance to/from unbalance converting circuit needs not to be coupled separately to the output of the power amplifier. Thus there is no power loss due to the balance to/from unbalance converting circuit, and power can be saved.

DETAILED DESCRIPTION OF THE EXEMPLARY EMBODIMENTS

Exemplary embodiments of the present invention are demonstrated hereinafter with reference to the accompanying drawings.

First Exemplary Embodiment

Figure 1:
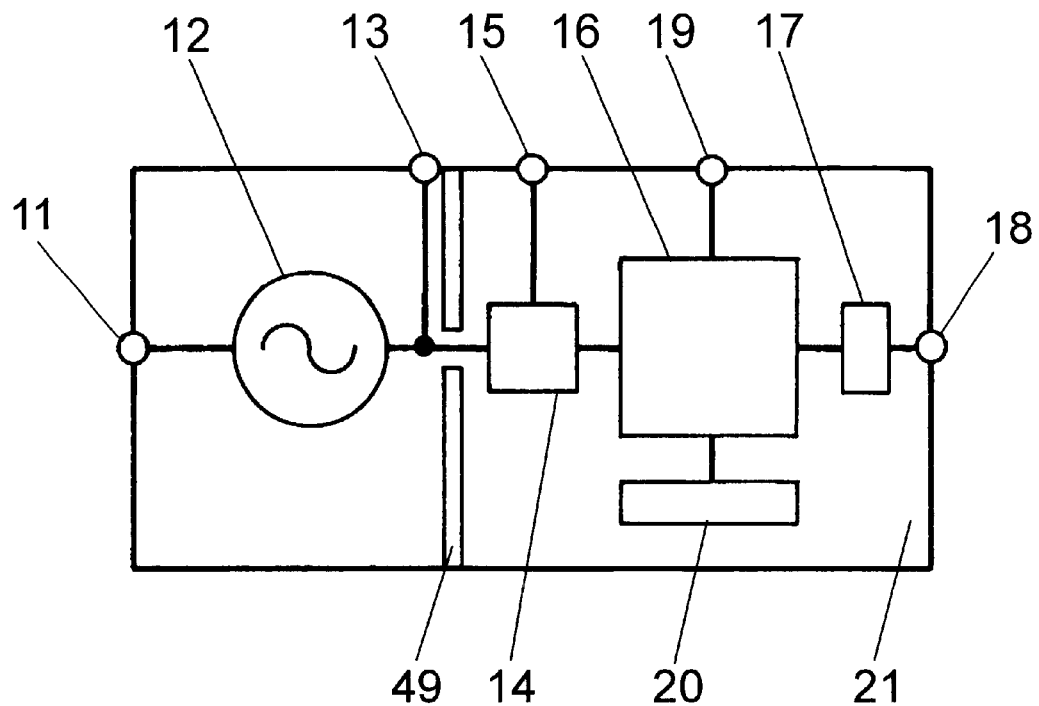
FIG. 1 is a block diagram of a voltage controlled oscillator (VCO) with a power amplifier in accordance with a first exemplary embodiment of the present invention.

FIG. 1 through FIG. 21 relate to a voltage controlled oscillator (VCO) with a power amplifier in accordance with the first exemplary embodiment. FIG. 1 is a block diagram showing the VCO in accordance with the first embodiment. In FIG. 1, input terminal 11 for receiving a controlling voltage is coupled to VCO section 12. An output from oscillating section 12 is coupled to monitor terminal 13 for the frequency oscillated by oscillating section 12 and to inspection means 14, which is controlled by a signal from inspection terminal 15. An output of inspection means 14 is fed into power amplifier 16, of which output is fed into output terminal 18 via matching circuit 17. Power control terminal 19 is coupled to amplifier 16, of which power amplitude is controlled by a signal from terminal 19. This structure allows an output power to be controlled depending upon a communication distance. For instance, the power amplitude is lowered at a short range communication to save power. Heat dissipation means 20 coupled to amplifier 16 dissipates the heat generated by amplifier 16 in order to meet a high power operation. Interference preventive means 49 prevents a signal tapped off from amplifier 16 from interfering with oscillating section 12. These circuits are accommodated in a piece of multi-layered board 21 made of resin.

Inspection means 14 separates oscillating section 12 and amplifier 16, and adjusts or inspects these two elements independently. Since this inspection means 14 is built in the VCO in accordance with the first embodiment, the VCO can be adjusted or inspected with ease. The VCO is accommodated on one multi-layered board 21, thus the VCO can be mounted to a device with ease.

Matching circuit 17 conveys the output from amplifier 16 to the low pass filter (LPF) of the device without any loss. Since the matching circuit 17 is built in the VCO, transmission power can be supplied to the device without any loss.

Figure 2:
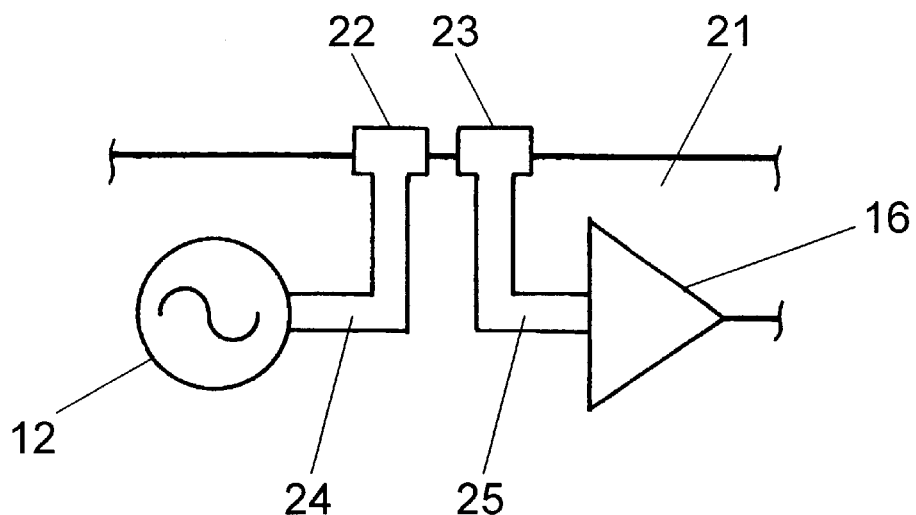
FIG. 2 is a circuit diagram showing a first example of inspection means of the VCO shown in FIG. 1.
Figure 3:
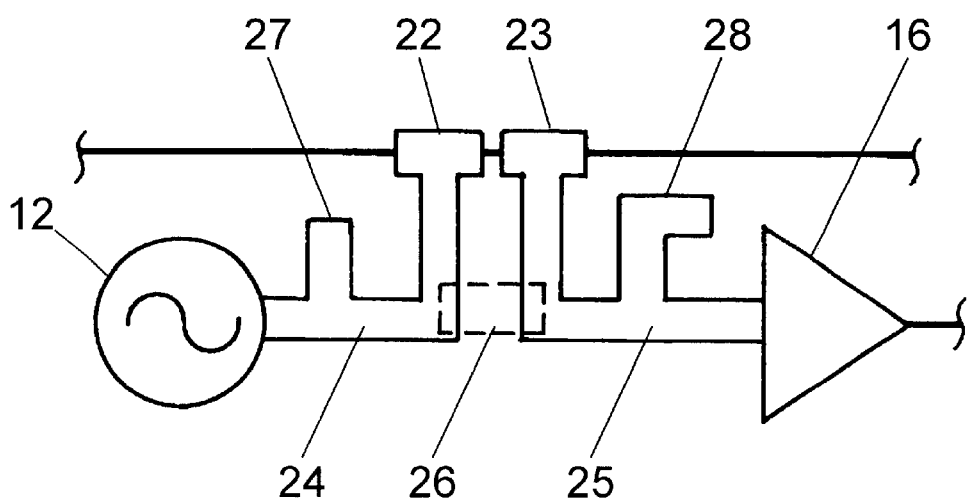
FIG. 3 is a circuit diagram showing a second example of the inspection means of the VCO shown in FIG. 1.
Figure 4:
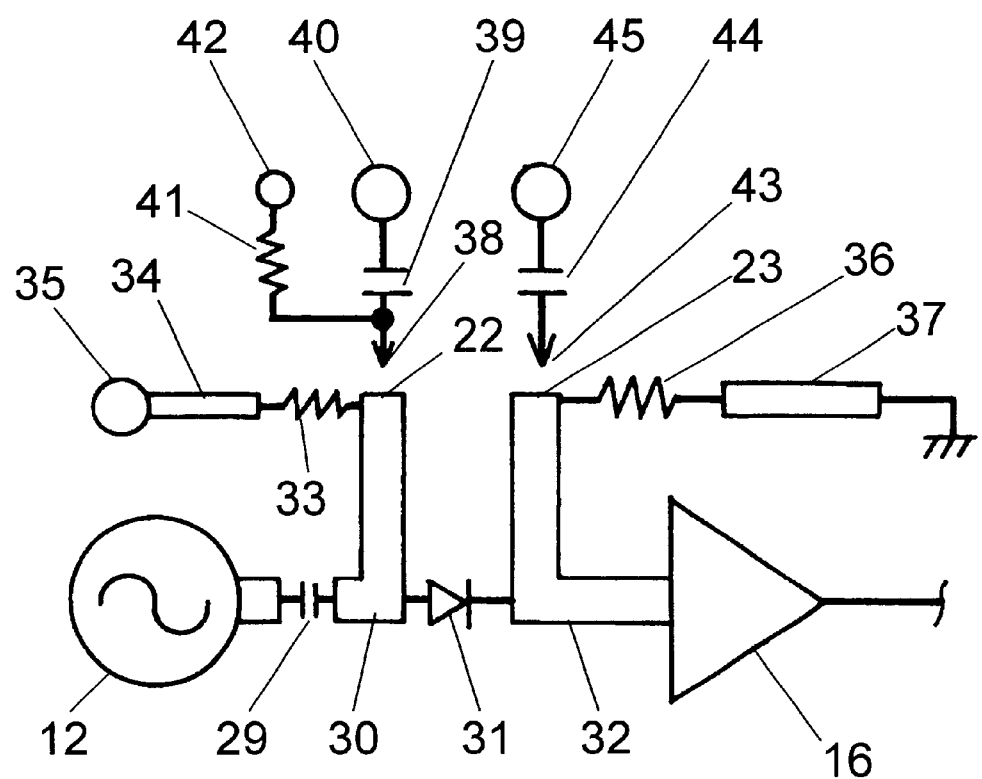
FIG. 4 is a circuit diagram showing a third example of the inspection means of the VCO shown in FIG. 1.
Figure 5:
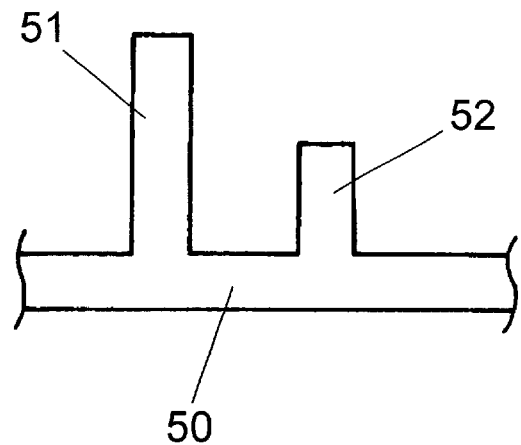
FIG. 5 shows a pattern of a harmonic removing circuit of the VCO shown in FIG. 1.
Figure 6:
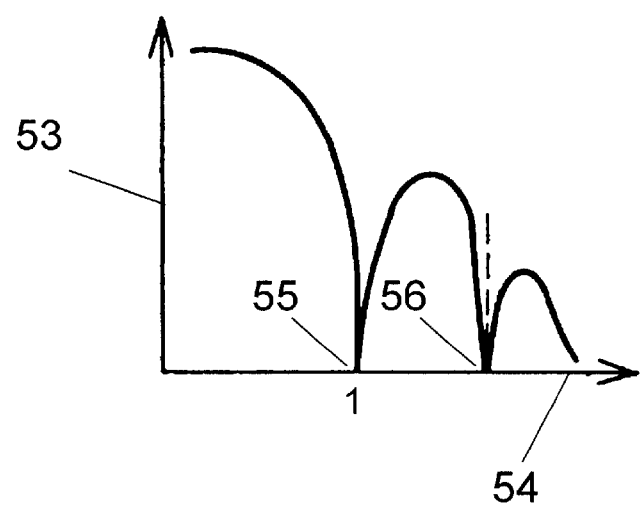
FIG. 6 shows characteristics of the harmonic removing circuit shown in FIG. 5.

FIG. 2 is a circuit diagram showing a first example of the inspection means discussed above, FIG. 3 is a circuit diagram showing a second example of the inspection means and FIG. 4 is a circuit diagram showing a third example of the inspection means. FIG. 5 shows a pattern of a harmonic removing circuit. FIG. 6 shows characteristics of the harmonic removing circuit shown in FIG. 5.

In FIG. 2, an output from VCO section 12 is fed into side-electrode 22 of multi-layered board 21 via strip-line 24 having 50Ω. Another side-electrode 23 is adjacent to and independent of electrode 22. Electrode 23 is coupled to an input terminal of power amplifier 16 via strip-line 25 having 50Ω. As such, the output from VCO section 12 and the input to amplifier 16 are independently tapped off to outside of board 21. Thus the VCO section 12 and the amplifier 16 can be electrically separated, and these two elements are adjusted or inspected independently with ease.

For instance, apply a controlling voltage to input terminal 11 shown in FIG. 1, then adjust a pattern inductance forming a resonant circuit in VCO section 12 with laser beam by trimming, while monitoring an oscillating frequency at electrode 22 (also functioning as monitor terminal 13 shown in FIG. 1.) On the other hand, apply a signal to electrode 23, then adjust a pattern inductance included amplifier 16 or matching circuit 17 with laser beam by trimming, while monitoring an output at output terminal 18 shown in FIG. 1.

After the adjustment or the inspection, electrode 22 is coupled to electrode 23 with the line having 50Ω outside the board (on the device side.) FIG. 3 shows a second example of inspection means 14. In this example, connecting section 26 made of jumper resistor is disposed between an output terminal of VCO section 12 and an input terminal of power amplifier 16. Therefore, after the adjustment or the inspection, a jumper wire of zero Ω is coupled to connecting section 26. Thus side-electrodes 22 and 23 are not necessarily to couple to each other on the device side.

In this example, open stub 27 is provided to strip-line 24. The length of open-stub 27 is set at a quarter of the wavelength of a third harmonic in a frequency output from VCO section 12, thereby attenuating the third harmonic. Open-stub 28 is provided to strip-line 25, and the length of this open stub is set at a quarter of the wavelength of a second harmonic in a frequency output from VCO section 12, thereby attenuating the second harmonic.

FIG. 4 shows a third example of inspection means 14. In this example, the output from VCO section 12 is supplied to strip line 30 having 50Ω via coupling capacitor 29 (approx. 5 pF chip capacitor.) Strip line 30 is coupled to strip line 32 having 50Ω via switching diode 31, and strip line 32 is coupled to an input terminal of amplifier 16.

Line 30 is coupled to side electrode 22 and also coupled to a first terminal of pattern inductance 34 via resistor 33 (approx. 470Ω chip resistor.) A second terminal of inductance 34 is coupled to power source 35. The length of inductance 34 is set at a quarter of the wavelength of oscillating frequency of VCO section 12, so that inductance 34 is practically open viewed from resistor 33. In other words, the impedance viewed from resistor 33 at the oscillating frequency is infinite, and thus it does not harmfully affect the line connecting VCO section 12 to amplifier 16. The value of resistor 33 (approx. 470Ω) is set approx. ten times as much as that of line 30 (50Ω), so that resistor 33 does not affect the characteristic impedance of line 30.

In the same manner, strip line 32 is coupled to side-electrode 23, and also coupled to a first terminal of pattern inductance 37 via resistor 36 (approx. 470Ω chip resistor). A second terminal of inductance 37 is grounded. The length of inductance 37 is set at a quarter of the wavelength of the oscillating frequency of VCO section 12, so that inductance 37 is practically open viewed from resistor 36. The value of resistor 36 is set at approx. ten times as much as that of line 32, thereby resistor 36 does not affect the characteristic impedance of line 32.

Contact pin 38 of inspecting device 40 monitors the oscillating frequency of VCO section 12. Signals to be monitored through pin 38 is fed into inspecting device 40 via capacitor 39. Pin 38 is coupled to minus-power-source 42 (approx.–15V) via resistor 41 (approx. 470Ω.) Pin 43 of inspecting device 45 supplies a signal to amplifier 16. Inspecting device 45 supplies the signal to pin 43 via capacitor 44.

Pin 38 is brought into contact with electrode 22, so that minus-power-source 42 adversely biases diode 31, whereby diode 31 is turned off. Therefore, at this status, VCO section 12 is separated from amplifier 16, so that both the elements can be adjusted or inspected independently. When pin 38 is off from electrode 22, power source 35 forwardly biases diode 31, whereby diode 31 is turned on, then VCO section 12 is coupled to amplifier 16.

As discussed above, on-off means is simply structured, i.e., the anode of diode 31 is coupled to power source 35 via resistor 33, and the cathode of diode 31 is grounded via resistor 36. This on-off means can turn on and off between the output terminal of VCO section 12 and the input terminal of power amplifier 16, so that the VCO can be downsized and manufactured at an inexpensive cost.

FIG. 5 shows a pattern of a harmonic removing circuit in the VCO with a power amplifier shown in FIG. 1. FIG. 6 shows the characteristics of the harmonic removing circuit shown in FIG. 5. This harmonic removing circuit is provided at the output terminal of VCO section 12.

In FIG. 5, open stubs 51 and 52 are provided to strip-line 50 to which the output terminal of VCO section 12 shown in FIG. 1 is coupled. The lengths of both stubs 51 and 52 are set at a quarter of the wavelength of the frequency supplied to line 50, so that the frequency is removed. FIG. 6 shows the characteristics. Vertical axis 53 represents an attenuated amount, and horizontal axis 54 represents a frequency. For instance, the length of stub 51 is set at a quarter of doubled oscillating frequency of VCO section 12, the second harmonic of VCO section 12 is attenuated down to point 55. In the same manner, the length of stub 52 is set at a quarter of tripled oscillating frequency of VCO section 12, the third harmonic is attenuated down to point 56. As such, stubs 51 and 52 are provided to the output terminal of VCO section 12, so that the interference harmonic can be removed.

As discussed above, in this first embodiment, the stubs are provided to remove harmonic of which frequency is at least two times as much as the oscillating frequency supplied from VCO section 12, so that the harmonic can be removed. As a result, there is little possibility that an interfering wave is output.

Figure 7:
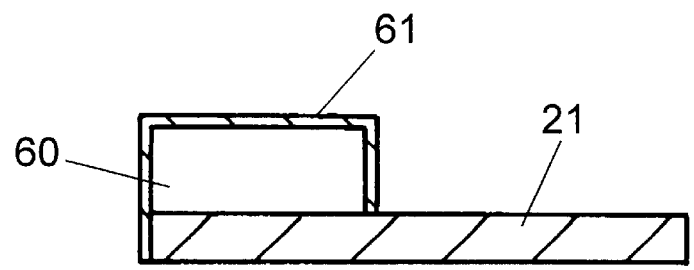
FIG. 7 is a cross section showing a first example of interference preventive means of the VCO shown in FIG. 1.
Figure 8:
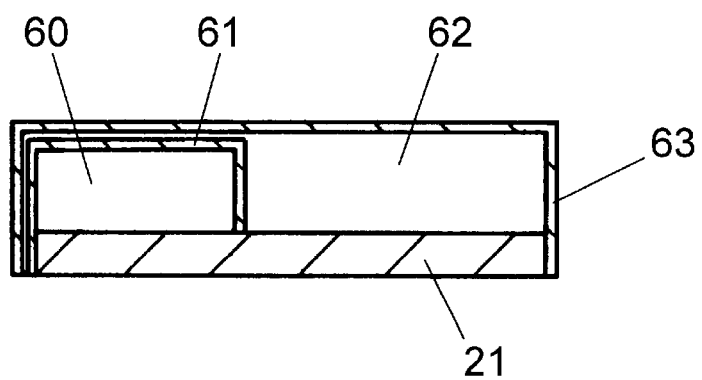
FIG. 8 is a cross section showing a second example of the interference preventive means of the VCO shown in FIG. 1.
Figure 9:
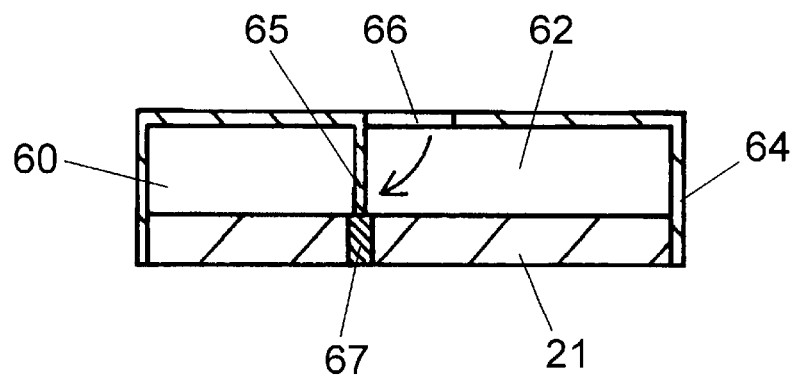
FIG. 9 is a cross section showing a third example of the interference preventive means of the VCO shown in FIG. 1.
Figure 10:
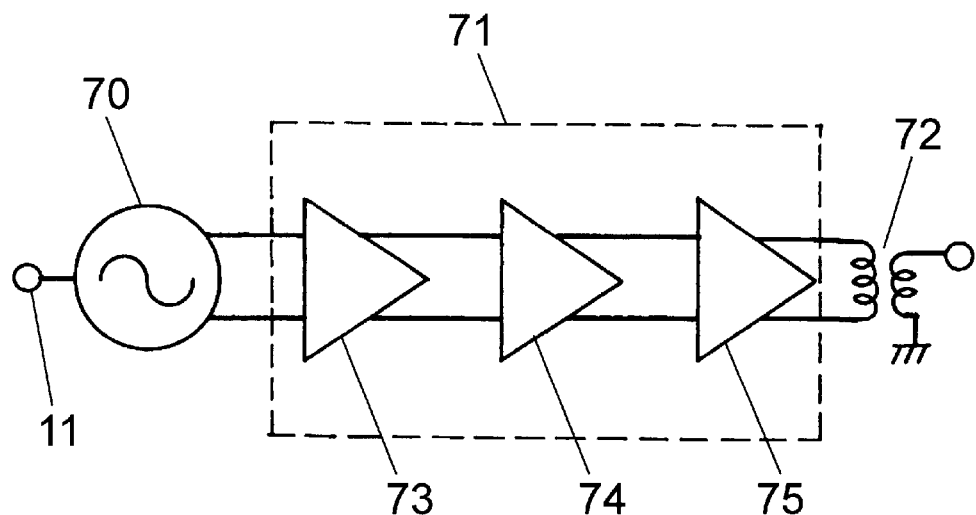
FIG. 10 is a block diagram showing a fourth example of the interference preventive means of the VCO shown in FIG. 1.

FIGS. 7, 8, and 9 are cross sections showing a first, second, and third examples of interference preventive means in the VCO with a power amplifier shown in FIG. 1. FIG. 10 is a block diagram showing a fourth example. The first example shown in FIG. 7 illustrates that active side 60 (parts mounted side) of VCO section 12 on board 21 is covered by metallic shielding case 61. This structure prevents interfering wave from entering into VCO section 12 from amplifier 16. Amplifier 16 is not covered by a shielding case, therefore, it is open to outside, which improves heat dissipation capability.

In the second example of interference preventive means shown in FIG. 8, metallic shielding case 63 is provided to cover active side 62 of amplifier 16, on top of the first example shown in FIG. 7, thereby preventing interfering wave supplied from amplifier 16 to VCO section 12. The second example also provides an entire active side (parts mounted side) on board 21 with shielding, and has physically no peaks and valleys on an outer wall because of the entire shielding, so that the VCO as a whole can be handled with ease. This physical advantage allows the device to integrate the VCO with ease.

In the third example shown in FIG. 9, integrated shield case 64 covers active side 60 of VCO section 12 and active side 61 of amplifier 16. Shield case 64 forms partition plate 65 by cutting a part thereof and bending the part at 90 degree. Partition plate 65 separates active sides 60 and 62 in terms of high frequency, thereby preventing interfering wave from intruding into VCO section 12 from amplifier 16. Hole 66 produced by cutting and bending the part of case 64 is placed above active side 62 of amplifier 16, so that amplifier 16 gets better heat dissipation. A lower end of partition plate 65 is soldered to through hole 67 provided board 21, and also grounded. In this third example, since shield case 64 is integrated, the cost can be lowered. A top plate on the amplifier side is cut, so that the heat dissipation of amplifier 16 is improved.

Cases 61, 63 and 64 shown in FIGS. 7–9 are made by punching a sheet of metal with the tooling die and bent at 90 degree in the punching direction. The ends of bent portion are grounded via side-electrode of board 21. This structure allows cases 61, 63 and 64 to be directly grounded. Thus these cases are hardly intruded by interference from the outside. Burrs are produced by punching a sheet of metal with the tooling die; however, these burrs are brought into contact with the side-electrode, which produces spaces between the bent end and the side-electrode. Because solder is filled into these spaces due to the capillary phenomenon, positive soldering can be achieved.

FIG. 10 shows the fourth example of interference preventive means. This example illustrates that VCO section 12 and amplifier 16, both shown in FIG. 1, can be formed by a balance circuit made of SiGe, so that VCO section 12 and amplifier 16 formed by the balance circuit are produced as VCO section 70 and power amplifier 71. This structure allows both the elements to act against interference from the outside. An output from amplifier 71 is output as an unbalance signal via balance to/from unbalance converter 72.

Amplifier 71 shown in FIG. 10 and amplifier 16 shown in FIG. 1 are both formed by three amplifying units 73, 74 and 75 coupled to each other in series, and can gain the amplitude of approx. 1300 times. In other words, 3 mW input is amplified into 4 W output. According to this fourth example, interference to the electric circuit is prevented, therefore, the interference preventive means performs in a stable manner and can be integrated, so that downsizing and lowering the cost can be achieved.

Various types of interference preventive means are provided, so that interference from the outside to VCO section 70 can be prevented. As a result, the device can be designed with ease.

Figure 11:
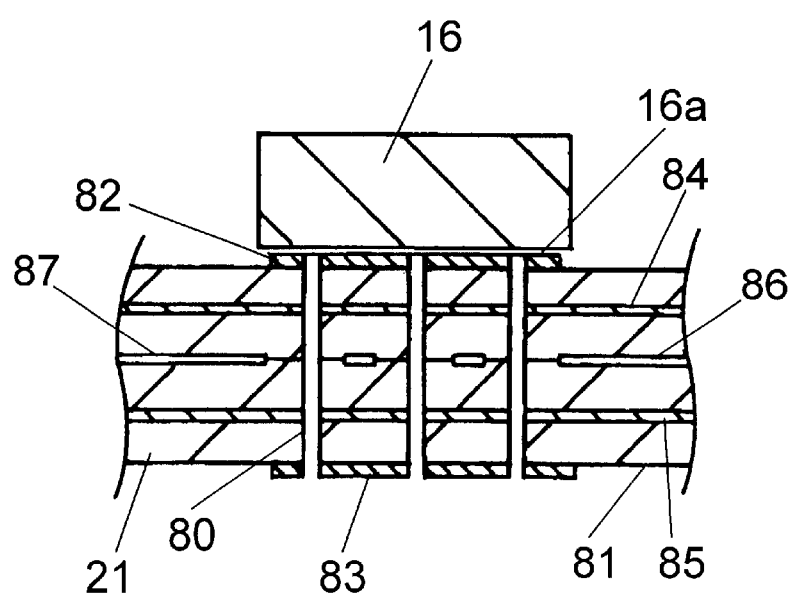
FIG. 11 is a cross section showing a first example of heat dissipation means of the VCO shown in FIG. 1.
Figure 12:
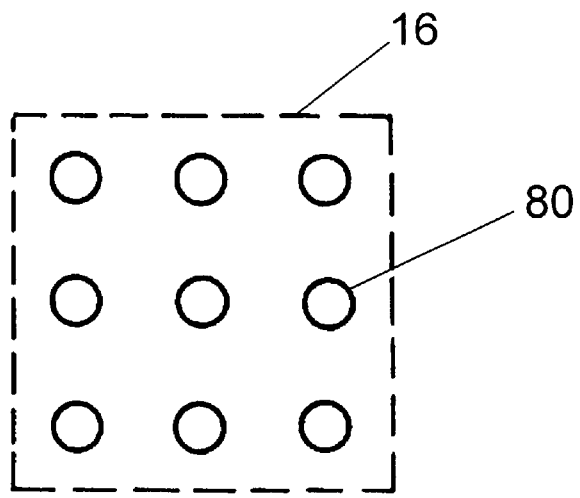
FIG. 12 is a plan view of the heat dissipation means shown in FIG. 11.
Figure 13:
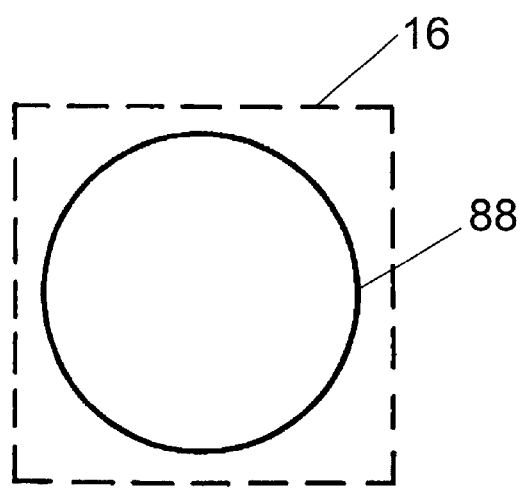
FIG. 13 is a plan view of a second example of the heat dissipation means of the VCO shown in FIG. 1.
Figure 14:
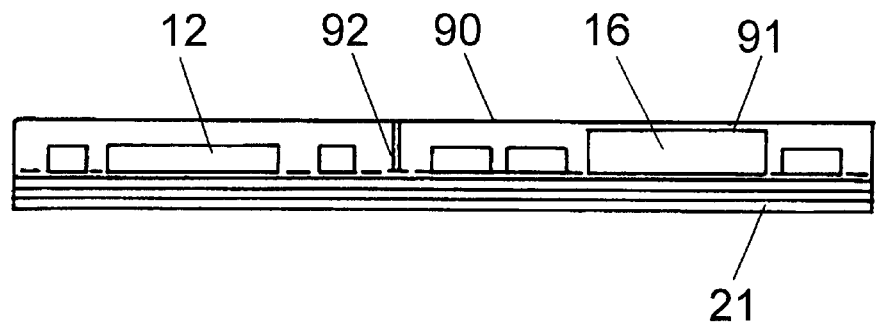
FIG. 14 is a cross section showing a third example of the heat dissipation means of the VCO shown in FIG. 1.
Figure 15:
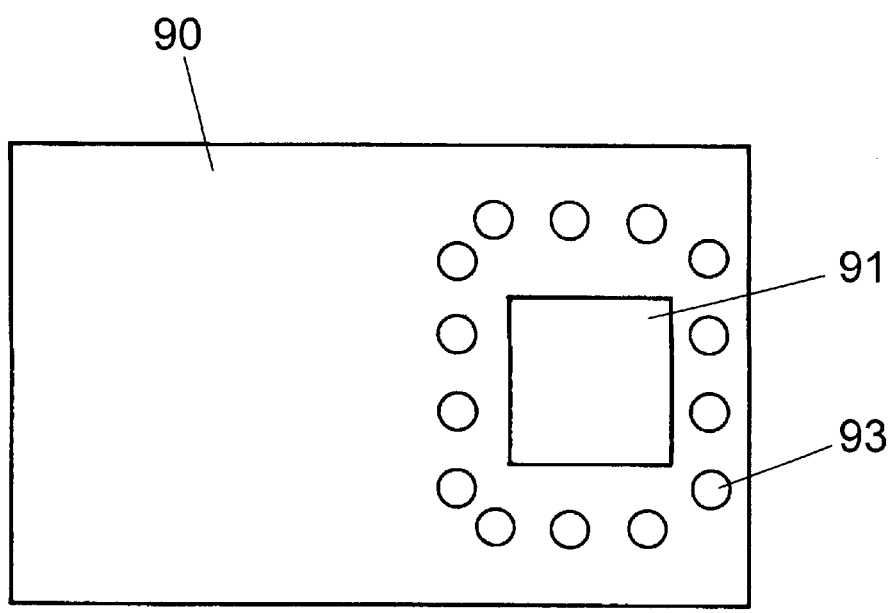
FIG. 15 is a plan view of the heat dissipation means shown in FIG. 14.

FIG. 11 is a cross section showing a first example of heat dissipation means of the VCO shown in FIG. 1, and FIG. 12 is a plan view of the same heat dissipation means. FIG. 13 is a plan view of a second example of the heat dissipation means. FIG. 14 is a cross section showing a third example of the heat dissipation means, and FIG. 15 is a plan view of the same heat dissipation means.

A first example of the heat dissipation means shown in FIG. 11 has the following structure:

(a) Power amplifier 16 is placed on multi-layered board 21.

(b) Heat dissipating section 16a is located at the bottom of amplifier 16 and led out to lower face 81 of board 21 through a plurality of through-holes 80.

In this example, nine through-holes 80 are available, and they are approx. 0.5 mm across. Copper foil 82 is formed on the upper face of board 21, and copper foil 83 is formed on the lower face of board 21.

Both copper foils 82 and 83 are connected to through-holes 80 so that heat can be conducted efficiently. Copper foil 83 is further coupled to the device per se and dissipates the heat. At the second layer of board 21, grounding plane 84 is formed, and another grounding plane 85 is formed at the fourth layer. Both grounding planes 84 and 85 are coupled to through-holes 80, thereby contributing to dissipating heat from amplifier 16.

Multi-layered board 21 is further detailed with reference to FIG. 11. Board 21 is made of glass epoxy resin and has five layers. As discussed above, the second and fourth layers function as grounding planes 84 and 85. The third layer has strip-line 86 and inductor 87. This structure allows line 86 to have a higher Q value because line 86 is sandwiched by grounding planes 84 and 85.

On lower face 81, no elements except a part of the side-electrode and copper foil 83 for heat dissipation are provided. Copper foil 83 has approx. the same outer dimensions as those of amplifier 16. This structure allows the pattern wiring in the device to be routed with less restrictions. In other words, board 21 is placed on a printed circuit board of the device, and lower face 81 of board 21 has no wiring and is thus insulated. Therefore, on the printed circuit board (PCB) of the device, the wiring can be routed free from worrying about a short-circuit, and the PCB can be handled with ease.

FIG. 12 is a plan view of what is shown in FIG. 11. As shown in FIG. 12, nine through-holes 80 are provided in the lower face of amplifier 16 at even intervals.

As discussed above, in the first example of the heat dissipation means, a plurality of through-holes 80 are provided in multi-layered board 21 facing to the bottom plate of power amplifier 16, and the heat from amplifier 16 is dissipated to the lower face of board 21 via through-holes 80. A heat sink plate outside the board can be provided to through-holes 80 led out to the lower face of multi-layered board 21, so that heat dissipation characteristics can be improved significantly thanks to this outer heat sink plate. The grounding planes 84 and 85 provided at inner layers 21 are coupled to through-holes 80, thereby increasing the heat dissipation characteristics further more without expanding the dimensions. In other words, the grounding planes 84 and 85 function as heat sinks in addition to grounding.

The second example shown in FIG. 13 of the heat dissipation means comprises one large through-hole 88, which is filled with solder thereby dissipating the heat generated by amplifier 16 from the lower face of the board. In this case, since through-hole 88 is large, amplifier 16 can be replaced with ease using this through-hole 88. In this example, through-hole 88 is 1.5 mm across. The cross sectional area of through-hole 88 can be approx. 50% of the bottom area of amplifier 16.

The second example of the heat dissipation has large through-hole 88, thus power amplifier 16 can be replaced or repaired with ease from the lower face of multi-layered board 21. A heat sink plate outside of board 21 can be provided to through-hole 88 led out to the lower face of board 21, so that the heat dissipation characteristics can be improved depending on the heat sink plate.

The third example of the heat dissipation means shown in FIG. 14 has the following structure: The upper face of multi-layered board 21 is covered by metallic shield case 90. A part of shield case 90 is cut and bent, thereby forming contact section 91. Contact section 91 is brought into contact with a top plate of amplifier 16 placed on board 21, so that the heat from amplifier 16 is dissipated. Partition plate 92 is unitarily formed with case 90. Partition plate 92 separates VCO section 12 from amplifier 16 in terms of high frequency, so that the harmonic from amplifier 16 does not interfere with VCO section 12.

FIG. 15 is a plan view of what is shown in FIG. 14. As shown in FIG. 15, contact section 91 shaping in approx. the same figure as amplifier 16 is formed, and a plurality of heat dissipating holes 93 (14 holes in this example) having a small diameter are formed around contact section 91.

In the third example, as discussed above, shield case 90 covering the power amplifier is provided, and a part of case 90 is cut and bent, thereby bringing the part into contact with the top face of amplifier 16. Thus shield case 90 functions both as a heat sink plate and shielding.

Figure 16:
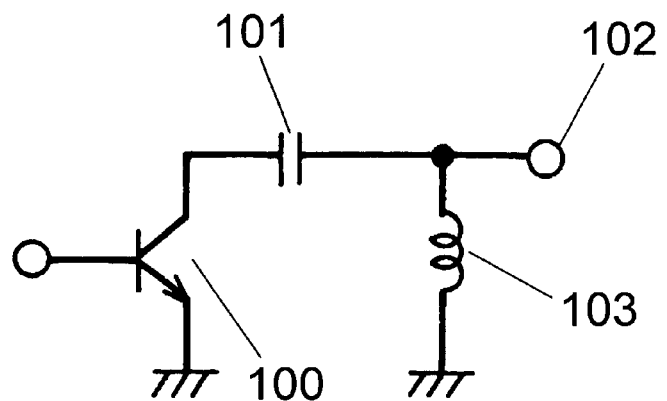
FIG. 16 shows a basic circuit of a matching circuit of the VCO shown in FIG. 1.
Figure 17:
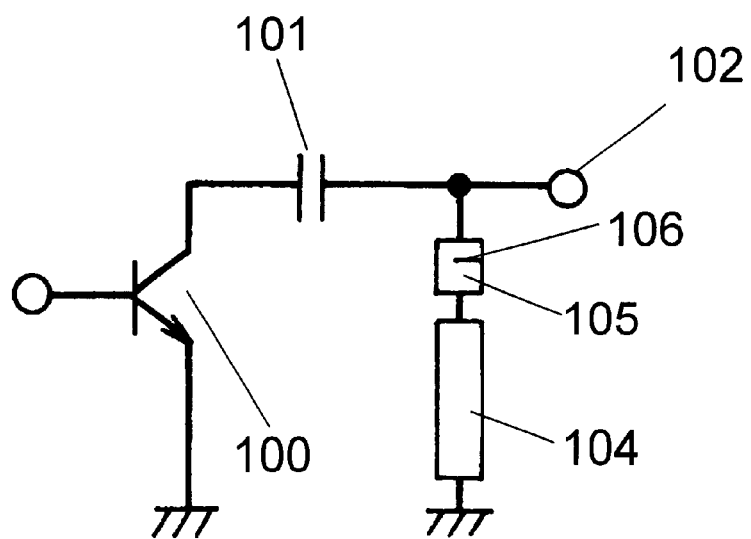
FIG. 17 is a circuit diagram showing a first example of the matching circuit of the VCO shown in FIG. 1.
Figure 18:
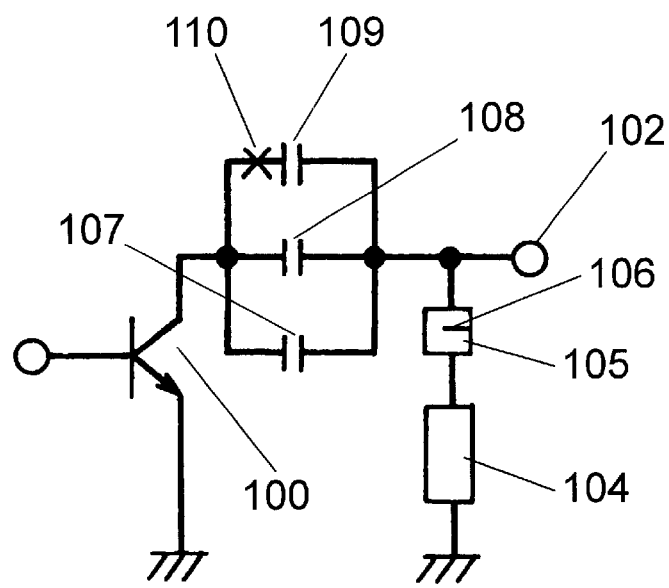
FIG. 18 is a circuit diagram showing a second example of the matching circuit of the VCO shown in FIG. 1.
Figure 19:
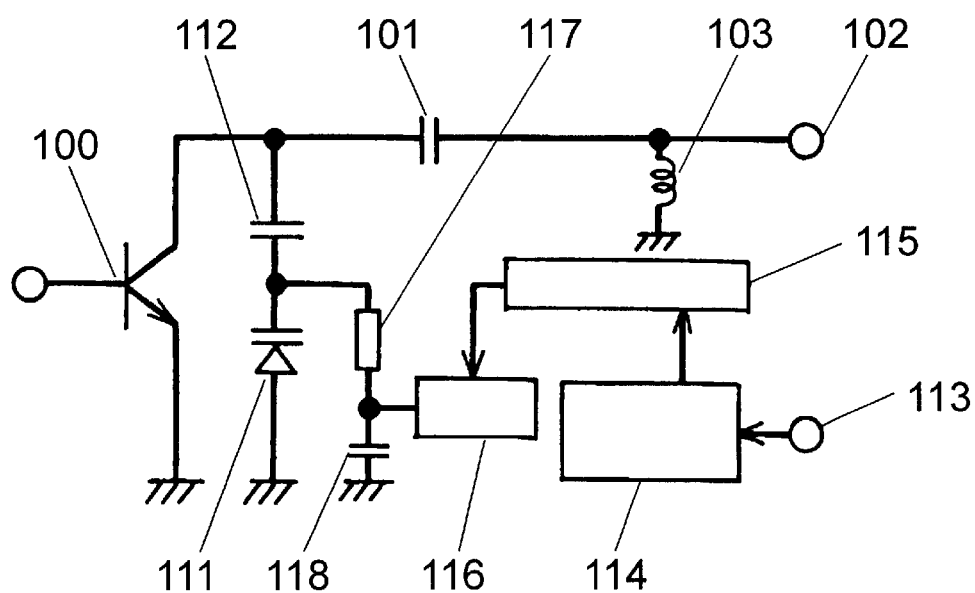
FIG. 19 is a circuit diagram showing a third example of the matching circuit of the VCO shown in FIG. 1.

FIG. 16 shows a basic circuit diagram of a matching circuit in the VCO of high power shown in FIG. 1. FIGS. 17, 18 and 19 show a first, second and third examples of matching circuit 17 shown in FIG. 1. These examples of matching circuits convert the output impedance of several ohms of amplifier 16 into 50Ω system, thereby reducing the loss of signals transmitted.

In FIG. 16, the collector of power transistor 100 is coupled to output terminal 102 via capacitor 101. Inductor 103 is coupled between output terminal 102 and the grounding. The emitter of transistor 100 is grounded. Based on the ratio of electrostatic capacitance C0 between the collector and the emitter of transistor 100 vs. electrostatic capacitance C1 of capacitor 101, the output impedance of transistor 100 is adapted to the characteristic impedance (50Ω) of the strip line. A tuning circuit is formed by a combined capacitance of C0 and C1 together with the inductance of inductor 103, so that the output from transistor 100 is efficiently supplied to output terminal 102.

In the first example of the matching circuit 17 shown in FIG. 17, inductor 103 shown in FIG. 16 is formed by pattern inductors 104 and 105 coupled in series. Inductor 104 is formed at the third layer of board 21 and led out to the upper face of board 21 via the through-hole, then coupled to inductor 105, which is adjusted for matching with laser beam by trimming 106.

In the first example of the matching circuit, as discussed above, the inductance of pattern inductor 105 is adjusted, so that the power from power amplifier 16 can be sent without loss. The inductor is adjusted with laser beam, so that the adjustment can be automated. An adjustment section of pattern inductor 105 is formed on the upper face of board 21, so that the adjustment can be carried out with ease. Non-adjustment section of pattern inductor 104 is formed at inside layer of board 21, so that the matching circuit can be downsized.

In the second example of the matching circuit shown in FIG. 18, capacitor 101 shown in FIG. 17 is formed by laser trimming capacitors 107, 108 and 109 coupled in parallel, and these capacitors are trimmed 110 with laser beam upon necessity, so that the output impedance is adjusted.

An electrostatic capacitance is adjusted with laser-trimming-capacitors 107, 108 and 109, thus the output impedance can be exactly matched, and the adjustment is carried out with laser beam, therefore, the adjustment can be automated.

If both the pattern inductor and the laser trimming capacitors can be adjusted, inductance and electrostatic capacitance could be adjusted independently, so that the pass-through characteristics of the output frequency and the output impedance can be both matched exactly.

In the third example of the matching circuit shown in FIG. 19, matching circuit 17 shown in FIG. 1 is adjusted with a variable-capacity-capacitor depending on a controlling voltage.

In FIG. 19, the collector of power transistor 100 is grounded via capacitor 112 and variable-capacity-diode 111 coupled in series. The electrostatic capacitance of diode 111 is adjusted as follows: Control controlling circuit 114 based on a signal from control terminal 113, then set memory 115 at a given value. Convert the value of memory 115 with D/A converter 116 into an analog voltage, which is applied to a cathode of diode 111 via inductor 117, thereby adjusting the electrostatic capacitance of diode 111. Smoothing capacitor 118 is coupled between the output terminal of D/A converter 116 and the grounding.

The third example of the matching circuit, as discussed above, comprises variable-capacity-capacitor 111 and inductor 103, and variable-capacity-capacitor 111 is controlled with a voltage, whereby the matching is carried out. Thus the matching circuit can be adjusted electrically from the outside with ease, and every time when a band is switched, an optimum value can follow the band by adjustment. A controlling voltage based on a signal from control terminal 113 controls a voltage applied to variable-capacity-capacitor 111, so that the optimum value automatically follows by the adjustment every time when the band is switched.

Figure 20:
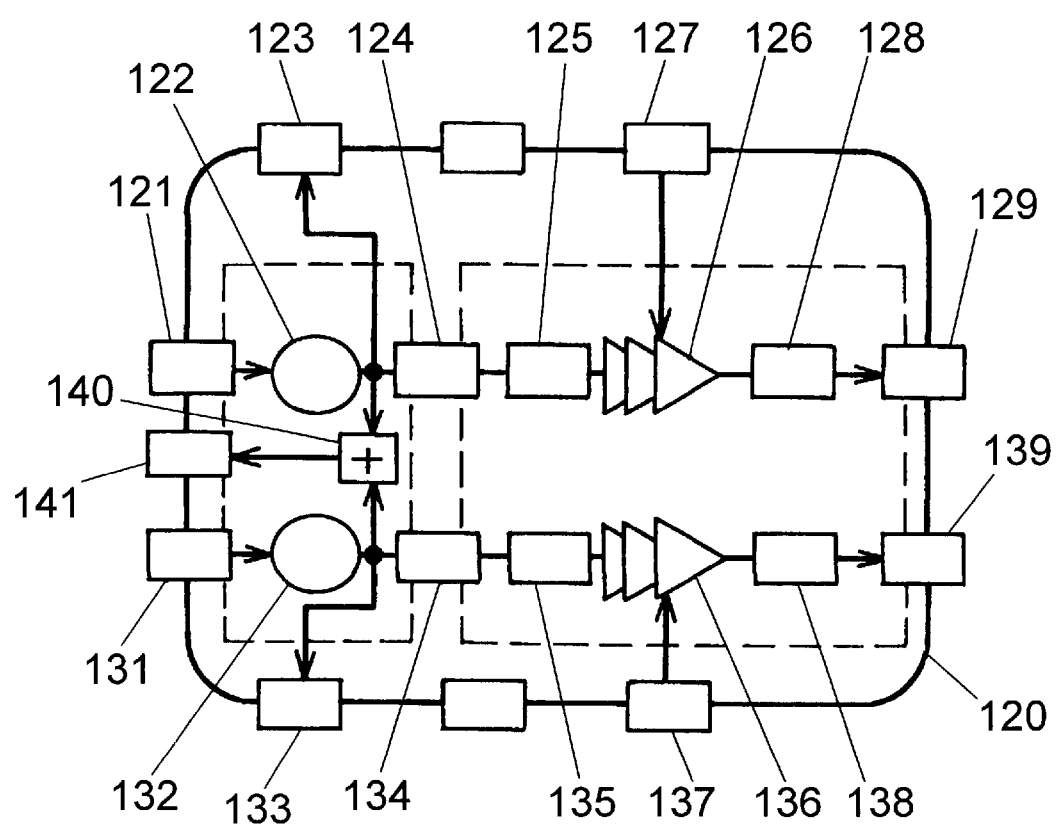
FIG. 20 is a block diagram showing two VCOs in accordance with the first embodiment are provided.

FIG. 20 is a block diagram where two VCOs with a power amplifier in accordance with the first embodiment are provided. In FIG. 20, a VCO with a power amplifier for global system for mobile communications (GSM), which VCO outputs a frequency of 900 MHz and a VCO with a power amplifier for digital communication system (DCS), which VCO outputs a frequency of 1800 MHz, are mounted to one multi-layered board 120. This structure allows realizing two-band cellular phones with ease.

The structure of the VCO with a power amplifier shown in FIG. 20 is detailed. Input terminal 121 for GSM receives a controlling voltage for GSM. Terminal 121 is coupled to an input terminal of first VCO 122, and an output from VCO 122 is sent to output terminal 123 of first VCO. The output of VCO 122 is also fed into input terminal of first power amplifier 126 via first inspection means 124 and first matching circuit 125. First power control terminal 127 is coupled to amplifier 126, of which output is sent to output terminal 129 for GSM via second matching circuit 128.

On the other hand, input terminal 131 for DCS receives a controlling voltage for DCS. Terminal 131 is coupled to an input terminal of second VCO 132. An output from VCO 132 is sent to output terminal 133 of second VCO. An output from VCO 132 is fed into an input terminal of second power amplifier 136 via second inspection means 134 and third matching circuit 135. Second power control terminal 137 is coupled to amplifier 136, of which output is coupled to output terminal 139 for DCS via fourth matching circuit 138.

Both the outputs from VCO 122 and VCO 132 are fed to phase-locked loop (PLL) terminal 141 via OR circuit 140. Terminal electrodes of both VCOs 122 and 132 are provided symmetrically with respect to board 120. This arrangement allows the patterns in the device to be routed with ease.

Interference preventive means 49 and heat dissipation means 20 both shown in FIG. 1 are not listed in FIG. 20; however, they are provided as same as in other embodiments. Matching circuits 125 and 135 are provided between VCOs 122, 132 and amplifier 126, 136, so that they match the impedance of VCOs with those of amplifiers and carry out transmission with less loss. In the same manner, amplifiers 126 and 136 comprise three amplifying units respectively as described in FIG. 10. On respective coupling paths of the three amplifying units, matching circuits (not shown) are provided in order to match the impedance for reducing losses.

The VCO with a power amplifier including a plurality of VCO sections and power amplifiers can be used in a multi-band cellular phone. The electrodes formed on the side of board 120 are symmetrically placed with each other, so that respective bands do not interfere with each other and also board 120 can be designed with ease. The board of the device may accommodate elements arranged symmetrically, so that the board can be designed with ease.

Figure 21:
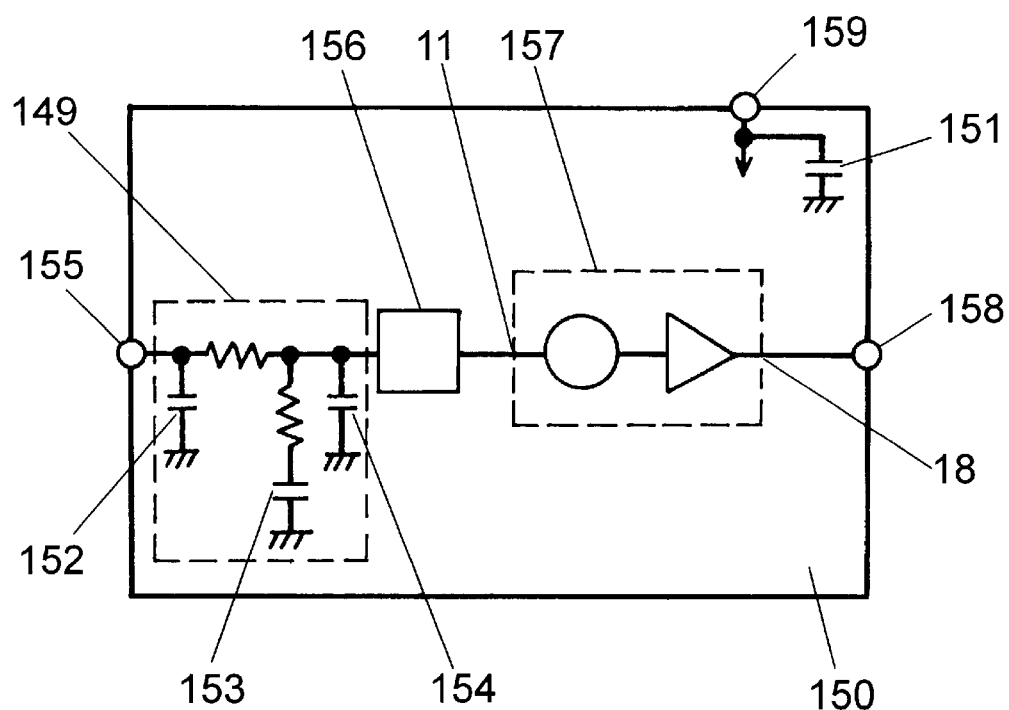
FIG. 21 is a circuit diagram of a sheet attached beneath the VCO in accordance with the first embodiment of the present invention.

FIG. 21 is a circuit diagram of a sheet attached beneath the VCO in accordance with the first embodiment of the present invention. To be more specific, FIG. 21 shows a circuit diagram of sheet 150 stick to the lower face of multi-layered board 21.

In FIG. 21, within sheet 150, by-path capacitor 151 for the power source which supplies power to the VCO and lag-lead-filter 149—comprising capacitors 152, 153, 154 and supplying a controlling voltage—are provided. Capacitor 153, requiring a large capacity, employs a film capacitor, so that capacitor 153 can be thinned and stable against shocks by external force. In other words, a lag-lead-filter 149—producing no noise if a shock is applied—can be available, because the film capacitor does not have piezoelectric effect.

Input 155 to sheet 150 is sent to input terminal 11 of VCO 157 with a power amplifier via lag-lead-filter 149 and LPF 156. Output 18 from VCO 157 is tapped off as it is from terminal 158. Terminal 159 is grounded via capacitor 151 and also directly coupled to a power source terminal of VCO 157.

As discussed above, the film capacitor is stuck beneath the lower face of the multi-layered board, and this capacitor is used at least as a capacitor of the lag-lead-filter which supplies a controlling voltage of the VCO section. This structure allows the VCO with a power amplifier of the present invention to obtain a frequency stable against vibrations because the film capacity does not have piezoelectric effect. Since the VCO employs the capacitor of film type, the height of the VCO increases little.

Second Exemplary Embodiment

Figure 22:
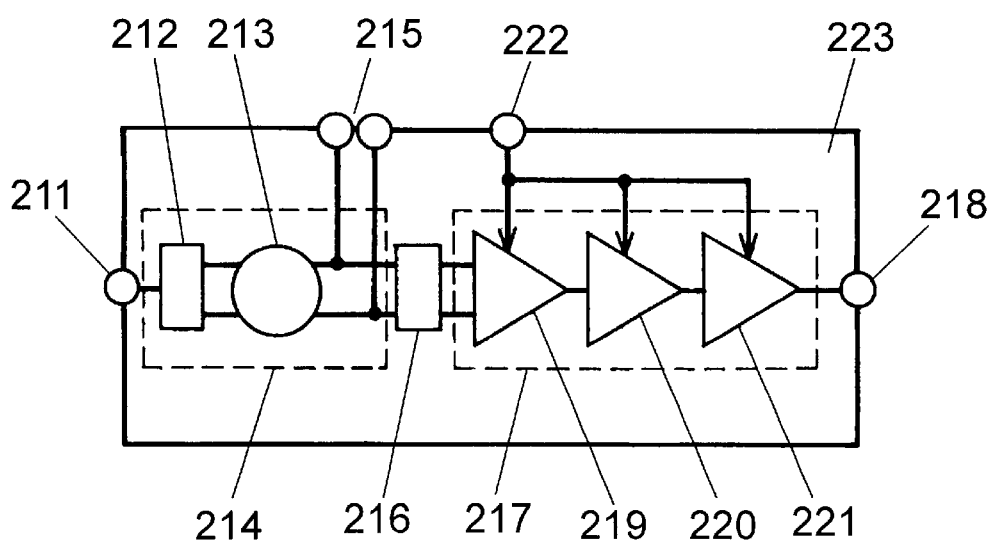
FIG. 22 is a block diagram showing a VCO in accordance with a second exemplary embodiment of the present invention.

FIG. 22 is a block diagram of a voltage controlled oscillator (VCO) with a power amplifier in accordance with the second exemplary embodiment. In FIG. 22, input terminal 211 receives a controlling voltage, and terminal 211 is coupled to balance amplifying circuit 213 via resonant circuit 212. The output from balance amplifying circuit 213 is sent to two output terminals 215 as an output from VCO section 214, and supplied to power amplifier 217 via matching circuit 216. The output from amplifier 217 is sent to output terminal 218. Groundings (not shown) of oscillating section 214 and amplifier 217 are independently led out to outside of the package, so that oscillating section 214 and amplifier 217 do not interfere with each other and they can exert their performance 100%.

Amplifier 217 is formed by coupling three amplifying circuits 219, 220 and 221 in series in this order. Amplifying circuit 219 amplifies a signal of approx. 5 dBm (approx. 3 mW) to approx. 20 dBm, the next circuit 220 amplifies this signal to approx. 30 dBm, then the third one amplifies the signal to approx. 36 dBm (approx. 4 W) and outputs the amplified signal to terminal 218. In a conventional VCO, final output amplified to 36 dBm is lowered by approx. 1.0 dBm due to the balance to/from unbalance converting circuit. However, in the present invention, the balance to/from unbalance converting circuit is provided to amplifying circuit 219 of the first stage. Thus approx. 36 dBm signal tapped off from terminal 218 does not need the conventional balance to/from unbalance converting circuit, so that no attenuation of the signal is expected. As a result, an antenna of a cellular phone integrating the VCO of the present invention outputs approx. 36 dBm signal as it is.

Meanwhile, in FIG. 22, power control terminal 222 is coupled to amplifier 217. The amplitudes of amplifying circuit 219, 220 and 221 are controlled with a signal input from power control terminal 222, so that an output power from power amplifier 217 can be arbitrarily controlled. This structure allows the output power to be controlled depending on a communication distance. For example, in the case of a short range communication, a power output level is lowered, thereby lowering a consumption current in amplifying circuit 221. As a result, power saving can be achieved.

In this second embodiment, the balance to/from unbalance converting circuit is integrated in amplifying circuit 219. Therefore, the onward amplifying circuits 220 and 221 are unbalanced amplifying circuits. This structure allows terminal 218 to output an unbalanced signal, thus no balance to/from unbalance converting circuit having approx. 1.0 dBm loss is needed thereafter. Oscillating section 214 comprises balance type resonant circuit 212 and balance amplifying circuit 213. Matching circuit 216 and first amplifying circuit 219 also include a balance circuit.

When oscillating section 214 and amplifier 217 are formed by SiGe technique, those elements of a lower cost and approx. the same performance comparing with conventional one formed by gallium arsenide (GaAs) are obtainable. Input terminal 211, output terminals 215, 218, and power control terminal 222 are led out from the side face of board 223, thereby allowing surface mounting.

The VCO with a power amplifier used in this embodiment has the following advantages: (1) The VCO is accommodated within one board 223 allowing surface mounting, the VCO can be mounted as it is to the device such as a cellular phone. Thus the device can be manufactured with ease. (2) In power amplifier 217, final amplifying circuit 221 outputs the unbalance signal, therefore, no additional balance to/from unbalance converting circuit is necessary at the output terminal of amplifier 217. As a result, no power loss due to the balance to/from unbalance converting circuit is expected, and power can be saved. (3) VCO section 214 and at least first amplifying circuit 219 include the balance amplifying circuit, and power amplifier 217 is formed by three amplifying circuits 219, 220 and 221. This structure allows a small signal to be converted from balance to unbalance and vice versa, thus amplifier 217 loses power only a little and encounters little interference by external signals.

Third Exemplary Embodiment

Figure 23:
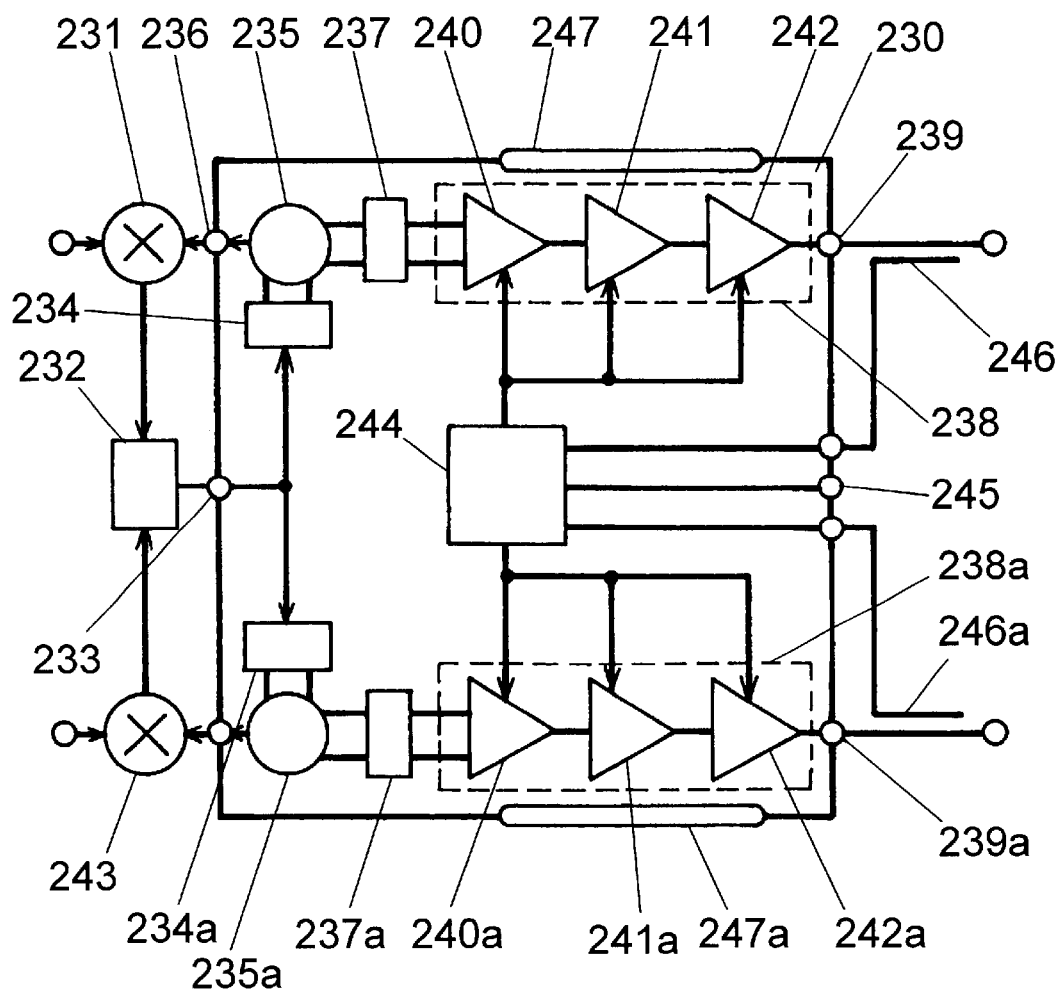
FIG. 23 is a block diagram showing a VCO in accordance with a third exemplary embodiment of the present invention.
Figure 24:
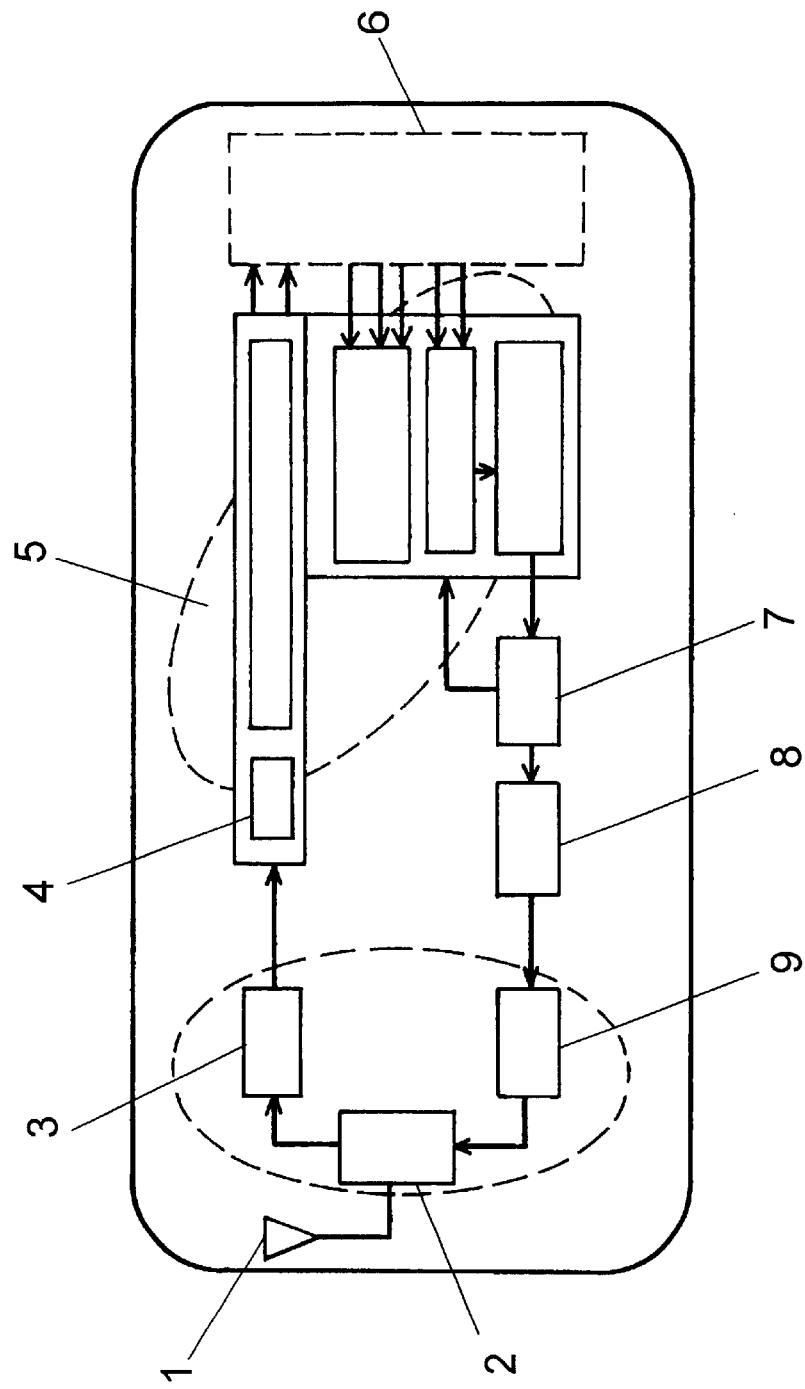
FIG. 24 is a block diagram showing a cellular phone which employs a conventional VCO.

FIG. 23 is a block diagram of a voltage controlled oscillator (VCO) with a power amplifier in accordance with the third embodiment of the present invention. In this third embodiment, a VCO outputting a frequency of 900 MHz and another VCO outputting a frequency of 1800 MHz are mounted to one package 230. These VCOs are used in global system for mobile communications (GSM) and digital communication system (DCS) respectively. Thus the VCO having this structure allows realizing a two-band cellular phone with ease.

The structure of the VCO in accordance with the third embodiment is demonstrated hereinafter. The output from phase detector 231 of GSM band is fed into input terminal 233 of controlling voltage. This controlling voltage is common to both GSM and DCS and provided to package 230 via low pass filter (LPF) 232. The controlling voltage fed into terminal 233 is coupled to balance amplifying circuit 235 via resonant circuit 234. The output from balance amplifying circuit 235 is fed into phase detector 231 as an output from the VCO section via output terminal 236. The output from balance amplifying circuit 235 is fed into power amplifier 238 via matching circuit 237. The output from amplifier 238 is supplied to output terminal 239 for GSM. Amplifier 238, as same as in the first embodiment, is formed by coupling three amplifying circuits 240, 241 and 242 in series. First amplifying circuit 240 carries out balance amplifying and includes a balance to/from unbalance converting circuit.

On the other hand, the output from phase detector 243 of DCS band is fed into input terminal 233 via LPF 232. Other circuits for DCS are the same as those for GSM, thus suffix "a" is attached to reference marks, thereby simplifying the descriptions.

In FIG. 23, the output from power control circuit 244 is fed into first amplifying circuits 240, 240a, second amplifying circuits 241, 241a, and third amplifying circuits 242, 242a. This structure allows the amplitude of amplifiers 238 and 238a to be controlled. This amplitude can be controlled from power control terminal 245, and this is the same as in the second embodiment. Couplers 246 and 246a provided to the lead out lines from output terminals 239, 239a can monitor the output power.

Heat sinks 247, 247a are thermally coupled to amplifiers 238, 238a and also coupled to grounding terminals of amplifiers 238, 238a. Heat dissipating sections such as heat sinks 247, 247a are led out from the side face of package 230. Heat sinks 247, 247a can be provided to the bottom of package 230. They can be also coupled to a mother board of the device.

As discussed above, heat sinks 247, 247a are led out from the package 230 as its terminals, therefore, a larger heat sink can be mounted to the package via these terminals, which results in saving power.

The heat sinks 247, 247a can be formed on the side face of the package 230, and make them larger than other terminals, so that the larger terminals per se have heat dissipation characteristics. Since these terminals are formed on the side face of the package, this structure allows surface mounting.

Heat sinks 247, 247a can be coupled to the grounding terminals of power amplifier 238, 238a, so that a number of terminals can be reduced, and receive little external noises.

As shown in FIG. 23, the terminals to the outside of the high-power VCO for GSM and that for DCS are provided symmetrically with respect to package 230. This arrangement of the terminals allows the patterns on the mother board in the device to be routed with ease.

In addition to the embodiments 1–3, the voltage controlled oscillating (VCO) section and the power amplifier can be integrated independently in separate packages. In this case, the VCO section is formed by SiGe technique, and the power amplifier can be formed by using gallium phosphide (GaP) or gallium nitride (GaN) technique.

Thanks to employing these techniques, the VCO section and the amplifier can be manufactured by different techniques, therefore, the yield rate as well as the productivity can be improved, and the better yield rate realizes a lower cost.

Plural systems of VCO sections as well as power amplifiers are integrated into one package respectively, system by system, and these packages are mounted to one board, so that a high power VCO for multi-bands are formed, and this can be used in a multi-bands cellular phone.

What is claimed is:

1. A voltage controlled oscillator (VCO) with a power amplifier comprising:
    (a) an input terminal for receiving a controlling voltage;
    (b) a voltage controlled oscillating section (VCO section) to which the controlling voltage is supplied;
    (c) a power amplifier to which an output from said VCO section is supplied;
    (d) a matching circuit to which an output from said power amplifier is supplied;
    (e) an output terminal to which an output from said matching circuit is supplied;
    (f) inspection means for carrying out one of adjustment or inspection on said VCO section and said power amplifier independently;
    (g) interference preventive means for preventing interference given from said power amplifier to said VCO section;
    (h) heat dissipation means for dissipating heat generated by said power amplifier to outside; and
    (i) a board to which elements described in items (a)–(h) are mounted.

2. The VCO as defined in claim 1, wherein said inspection means comprises (f-1) an electrode on a side face of said board, to which electrode the output from said VCO section is supplied, and (f-2) another electrode on the side face of said board, to which electrode an input to said amplifier is supplied independently of the output from said VCO section.

3. The VCO as defined in claim 1, wherein said inspection means comprises (f-1) an electrode on a side face of said board, to which electrode the output from said VCO section is supplied and (f-2) another electrode on the side face of said board, to which electrode an input to said amplifier is supplied, and (f-3) a jumper-resistor-mounting-section between an output terminal of said VCO section and an input terminal of said amplifier.

4. The VCO as defined in claim 3, wherein a stub is provided to an output of said VCO section, the stub for removing harmonic at least twice as much as oscillating frequency supplied from said VCO section.

5. The VCO as defined in claim 1, wherein said inspection means comprises (f-1) an electrode on a side face of said board, to which electrode the output from said VCO section is supplied, and (f-2) another electrode on the side face of said board, to which electrode an input to said amplifier is supplied, and (f-3) a diode between an output terminal of said VCO section and an input terminal of said power amplifier, and (f-4) on-off means for powering on and off the diode from outside.

6. The VCO as defined in claim 5, wherein the on-off means couples an anode of the diode to a power source via a first resistor and couples a cathode of the diode to grounding via a second resistor.

7. The VCO as defined in claim 6, wherein a value of the first resistor is approx. 10 times as much as a characteristic impedance of a first strip line coupled to the output terminal of said VCO section, and a value of the second resistor is approx. 10 times as much as a characteristic impedance of a second strip line coupled to the input terminal of said power amplifier.

8. The VCO as defined in claim 6, wherein a pattern inductors are placed between the first resistor and the power source, and also between the second resistor and the grounding, a length of the pattern inductors corresponds to approx. a quarter wavelength of the oscillating frequency supplied from said VCO section.

9. The VCO as defined in claim 1, wherein said interference preventive means covers said VCO section with a shield case.

10. The VCO as defined in claim 1, wherein said interference preventive means covers said VCO section and said power amplifier with a shield case, and said means partitions said VCO section and said amplifier with a partition plate.

11. The VCO as defined in claim 1, wherein said interference preventive means covers said VCO section and said power amplifier with a unitary shield case, and cuts and bends a top plate of the shield case on said amplifier side to partition said VCO section and said amplifier.

12. The VCO as defined in claim 1, wherein said VCO section and said power amplifier are both formed of a balance circuit respectively.

13. The VCO as defined in claim 1, wherein said board is made of a multi-layered board, and said heat dissipation means provides a plurality of through-holes in an area of the multi-layered board, and which area corresponds to a bottom face of said amplifier, heat generated by said amplifier travels through these through-holes to a lower face of the multi-layered board.

14. The VCO as defined in claim 13, wherein a grounding plane provided at an inner layer of the multi-layered board is coupled to the through-holes.

15. The VCO as defined in claim 1, wherein said board is made of a multi-layered board and said heat dissipation means provides a large through-hole in an area of the multi-layered board, and which area corresponds to a bottom face of said amplifier, heat generated by said amplifier travels through this through-hole to a lower face of the multi-layered board.

16. The VCO as defined in claim 1, wherein said heat dissipation means provides a shield case which covers said amplifier and cuts and bends a top plate of the shield case, so that the cut part of the shield case is brought into contact with a top face of said amplifier.

17. The VCO as defined in claim 1, wherein said matching circuit includes a capacitor and a pattern inductor, and matching adjustment is carried out by trimming the pattern inductor with a laser beam.

18. The VCO as defined in claim 17, wherein said board is made of a multi-layered board, and the pattern inductor is formed by a first pattern inductor and a second pattern inductor coupled with each other in series, wherein the second pattern inductor is formed at an inner layer of the multi-layered board and the first pattern layer is formed on an upper face of the multi-layered board, so that matching adjustment is carried out by trimming the first pattern inductor with laser beam.

19. The VCO as defined in claim 1, wherein said matching circuit includes a laser trimming capacitor and a pattern inductor, and matching adjustment is carried out by trimming the laser trimming capacitor with laser beam.

20. The VCO as defined in claim 1, wherein said matching circuit includes a laser trimming capacitor and a pattern inductor, and matching adjustment is carried out by trimming both the pattern inductor and the laser trimming capacitor with laser beam.

21. The VCO as defined in claim 1, wherein said matching circuit includes a variable capacity capacitor and an inductor, and matching is carried out by applying a voltage to the variable capacity capacitor.

22. The VCO as defined in claim 21, wherein the voltage applied to the variable capacity capacitor is controlled for matching.

23. The VCO as defined in claim 1, wherein a plurality of said VCO sections and a plurality of said power amplifiers are accommodated in said board.

24. The VCO as defined in claim 23, wherein said board is made of a multi-layered board, and electrodes formed on side faces of the multi-layered board are provided symmetrically.

25. The VCO as defined in claim 1, wherein said VCO section and said power amplifier are formed by silicon germanium (SiGe).

26. The VCO as defined in claim 1, wherein said board is made of resin and has five layers.

27. The VCO as defined in claim 26, wherein a second layer and a fourth layer of said board comprise grounding planes, and a strip line is provided at a third layer.

28. The VCO as defined in claim 26, wherein a fifth layer of said board is made of only an electrode pattern.

29. The VCO as defined in claim 1, wherein said board is made of a multi-layered board, and a film type capacitor is provided beneath a lower face of the multi-layered board, the capacitor is used at least as a capacitor included in a lag-lead-filter supplying the controlling voltage of said VCO section.

30. A voltage controlled oscillator (VCO) with a power amplifier comprising:

(a) an input terminal for receiving a controlling voltage;
(b) a voltage controlled oscillating section (VCO section) to which the controlling voltage is supplied;
(c) a power amplifier, to which an output from said VCO section is supplied, being formed by a plurality of amplifying circuits coupled with each other in series; and (d) an output terminal to which an output from said power amplifier is supplied, wherein said VCO section and at least a first amplifying circuit of said power amplifier include a balance circuit, and balance to/from unbalance converting circuit is provided in said power amplifier, which outputs an unbalance signal, and elements described in items (a)–(d) are accommodated in one multi-layered board allowing surface mounting.

31. The VCO as defined in claim 30, wherein said power amplifier is formed by three amplifying circuits, and a first amplifying circuit includes a balance to/from unbalance converting circuit.

32. The VCO as defined in claim 30, wherein said VCO section and said power amplifier are integrated in one package.

33. The VCO as defined in claim 32 includes a plurality of systems of said VCO sections and said amplifiers respectively.

34. The VCO as defined in claim 32, wherein said amplifier includes a heat dissipating section coupled thermally thereto, and the heat dissipating section is led out to outside as a terminal of the package.

35. The VCO as defined in claim 34, wherein a terminal of the heat dissipating section is formed on a side face of the package with a size larger than other terminals.

36. The VCO as defined in claim 35, wherein the terminal of the heat dissipating section is coupled to a grounding terminal of said power amplifier.

37. The VCO as defined in claim 32, wherein said power amplifier includes a heat dissipating section coupled thermally thereto, and the heat dissipating section is provided in a solderable manner to a bottom face of the package.

38. The VCO as defined in claim 37, wherein the heat dissipating section is coupled to a grounding terminal of said power amplifier.

39. The VCO as defined in claim 32, wherein a grounding terminal of said VCO section and that of said power amplifier are independently led out to outside of the package.

40. The VCO as defined in claim 30, wherein said power amplifier allows adjusting an amplitude thereof from outside.

41. The VCO as defined in claim 30, wherein said VCO section and said amplifier are formed by silicon germanium (SiGe).

42. The VCO as defined in claim 30, wherein said VCO section and said amplifier are integrated in separate packages, and said VCO section is formed by silicon germanium (SiGe), and said amplifier is formed one of gallium phosphide (GaP) and gallium nitride (GaN).

43. The VCO as defined in claim 42, wherein a plurality of systems of said VCO sections and said amplifiers are integrated in respective packages, and those packages are mounted to one printed circuit board.

* * * * *